(12) United States Patent
Mun et al.

(10) Patent No.: US 12,336,220 B2
(45) Date of Patent: Jun. 17, 2025

(54) EXTENDED-DRAIN METAL-OXIDE-SEMICONDUCTOR DEVICES WITH A GAP BETWEEN THE DRAIN AND BODY WELLS

(71) Applicant: GlobalFoundries Singapore Pte. Ltd., Singapore (SG)

(72) Inventors: Bong Woong Mun, Singapore (SG); Upinder Singh, Singapore (SG); Jeoung Mo Koo, Singapore (SG); Huihua Jiang, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 469 days.

(21) Appl. No.: 17/679,177

(22) Filed: Feb. 24, 2022

(65) Prior Publication Data
US 2023/0268436 A1    Aug. 24, 2023

(51) Int. Cl.
*H10D 30/65* (2025.01)
*H10D 30/01* (2025.01)

(52) U.S. Cl.
CPC ......... *H10D 30/65* (2025.01); *H10D 30/0281* (2025.01)

(58) Field of Classification Search
CPC ............. H01L 29/7816; H01L 29/7835; H01L 29/0696; H01L 29/0653; H01L 29/1095; H01L 29/66681; H01L 29/42368; H01L 29/0878; H01L 29/4175; H01L 29/4238; H01L 29/0847; H01L 29/41758; H01L 29/4983; H01L 29/78624; H01L 29/7832; H01L 29/7834; H01L 29/78615;
(Continued)

(56) References Cited

U.S. PATENT DOCUMENTS 6,353,252 B1 *  3/2002  Yasuhara ................ H01L 29/41
                                                   257/E29.268
7,074,659 B2     7/2006  Zuniga et al.
(Continued)

FOREIGN PATENT DOCUMENTS

| CN | 103199109 A  | 7/2013 |
| CN | 109273364 B  | 10/2021 |
| JP | 2017507502 A | 3/2017 |

OTHER PUBLICATIONS

Bong Woong Mun, "Extended-Drain Metal-Oxide-Semiconductor Devices With a Notched Gate Electrode" filed Jun. 8, 2021 as a U.S. Appl. No. 17/341,858.
(Continued)

*Primary Examiner* — Mark W Tornow
*Assistant Examiner* — Priya M Rampersaud
(74) *Attorney, Agent, or Firm* — Thompson Hine LLP; Francois Pagette (57) ABSTRACT

Structures for an extended-drain metal-oxide-semiconductor device and methods of forming a structure for an extended-drain metal-oxide-semiconductor device. The structure includes a semiconductor substrate, a body well in the semiconductor substrate, a source region in the body well, a drain well in the semiconductor substrate, a drain region in the drain well, and a gate electrode laterally positioned between the source region and the drain region. The drain well includes an edge adjacent to the body well, and the edge of the drain well has a spaced relationship with the body well.

10 Claims, 7 Drawing Sheets

(58) Field of Classification Search
CPC .......... H01L 29/66712; H01L 29/1045; H01L 29/66659; H01L 29/0634; H01L 29/0692; H01L 29/408; H01L 29/0615; H01L 29/0623; H10D 30/0281; H10D 30/65; H10D 30/0221; H10D 30/603; H10D 62/111; H10D 62/393; H10D 84/151; H10D 30/64; H10D 62/156; H10D 30/0291

See application file for complete search history.

(56) References Cited

U.S. PATENT DOCUMENTS

| | | | |
|---|---|---|---|
| 10,205,001 B2 | 2/2019 | Pendharkar et al. | |
| 10,461,156 B2 | 10/2019 | Cai | |
| 11,152,459 B2 | 10/2021 | Denison et al. | |
| 2011/0241092 A1* | 10/2011 | Khemka | H10D 84/87 |
| | | | 257/E21.616 |
| 2013/0069153 A1* | 3/2013 | Huang | H10D 62/111 |
| | | | 257/E29.256 |
| 2015/0145034 A1* | 5/2015 | Lee | H01L 29/7816 |
| | | | 438/286 |
| 2016/0343852 A1* | 11/2016 | Pendharkar | H01L 29/4238 |
| 2017/0323970 A1* | 11/2017 | Dolny | H10D 30/658 |
| 2017/0352756 A1* | 12/2017 | Lin | H10D 62/157 |

OTHER PUBLICATIONS

European Patent Office, Extended European Search Report and Written Opinion issued in European Patent Application No. 22199638.2 on Jul. 3, 2023 (8 pages).

\* cited by examiner

EXTENDED-DRAIN METAL-OXIDE-SEMICONDUCTOR DEVICES WITH A GAP BETWEEN THE DRAIN AND BODY WELLS

BACKGROUND

The disclosure relates generally to semiconductor devices and integrated circuit fabrication and, more specifically, to structures for an extended-drain metal-oxide-semiconductor device and methods of forming a structure for an extended-drain metal-oxide-semiconductor device.

High-voltage integrated circuits used, for example, in microwave/radiofrequency power amplifiers typically require specialized circuit technology capable of withstanding higher voltages. Extended-drain metal-oxide-semiconductor devices, also known as laterally-diffused metal-oxide-semiconductor devices, are designed to handle such higher voltages by incorporating additional transistor features, such as a drift well providing an extended drain, that increase the voltage handling capability. Extended-drain metal-oxide-semiconductor devices may be used, for example, for high-voltage power switching.

Extended-drain metal-oxide-semiconductor devices are characterized by, among other parameters, an output capacitance. The output capacitance includes contributions from a parasitic gate-drain capacitance and a parasitic gate-source capacitance that are related to voltage-dependent and temperature-dependent nonlinear charges that accumulate during switching. The output capacitance strongly influences the switching performance of an extended-drain metal-oxide-semiconductor device. In particular, as device size shrinks, the output capacitance may increase to an unacceptable value.

Improved structures for an extended-drain metal-oxide-semiconductor device and methods of forming a structure for an extended-drain metal-oxide-semiconductor device are needed.

SUMMARY

In an embodiment, a structure for an extended-drain metal-oxide-semiconductor device is provided. The structure includes a semiconductor substrate, a body well in the semiconductor substrate, a source region in the body well, a drain well in the semiconductor substrate, a drain region in the drain well, and a gate electrode laterally positioned between the source region and the drain region. The drain well includes an edge adjacent to the body well, and the edge of the drain well has a spaced relationship with the body well.

In an embodiment, a method of forming a structure for an extended-drain metal-oxide-semiconductor device is provided. The method includes forming a body well in a semiconductor substrate, forming a source region in the body well, forming a drain well in the semiconductor substrate, forming a drain region in the drain well, and forming a gate electrode laterally positioned between the source region and the drain region. The drain well includes an edge adjacent to the body well, and the edge of the drain well has a spaced relationship with the body well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
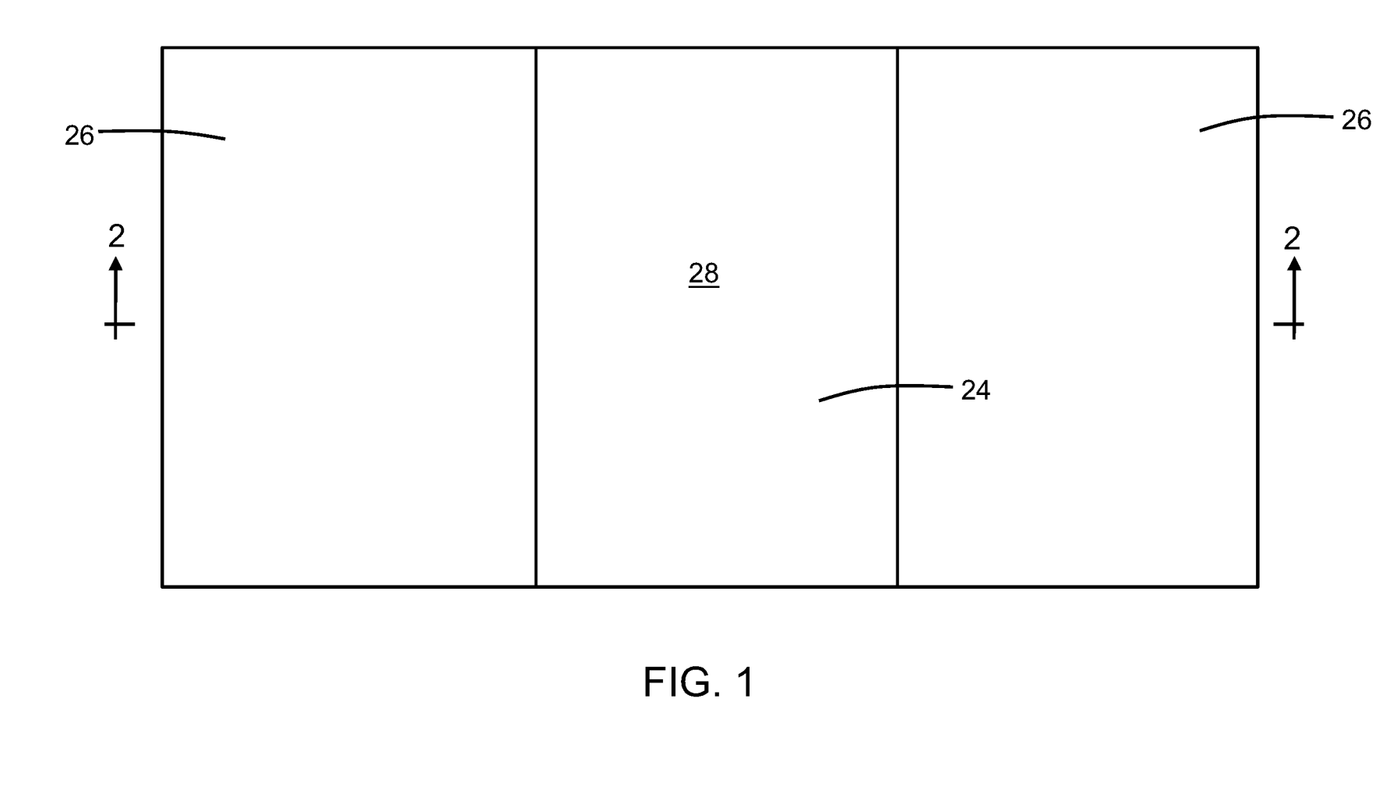
FIG. 1 is top view of a structure at an initial fabrication stage of a processing method in accordance with embodiments of the invention.

With reference to FIG. 1 and in accordance with embodiments of the invention, a structure 10 for an extended-drain metal-oxide-semiconductor device includes a substrate 12 and a shallow trench isolation region 14 that is arranged in the substrate 12 to surround an active device region. The substrate 12 may be comprised of a semiconductor material, such as single-crystal silicon. In an embodiment, the substrate 12 may be lightly doped to have p-type conductivity. The shallow trench isolation region 14 may be formed by patterning shallow trenches in the substrate 12 with lithography and etching processes, depositing a dielectric material, such as silicon dioxide, to fill the shallow trenches, and planarizing and/or recessing the deposited dielectric material.

A well 16 is formed over a given depth range beneath a top surface 11 of the substrate 12. The well 16 may be formed in the substrate 12 by introducing a dopant by, for example, ion implantation with given implantation conditions. The well 16 is doped to have an opposite conductivity type from the substrate 12. In an embodiment, the well 16 may be comprised of semiconductor material that is doped with an n-type dopant to provide n-type conductivity. In an embodiment, the dose of the dopant implanted to form the well 16 may range from $1\times10^{12}$ ions/cm$^2$ to $1\times10^{13}$ ions/cm$^2$. The well 16 may provide a buried isolation well in the completed structure 10. The well 16 may be accessible at the top surface 11 of the substrate 12 for the subsequent establishment of an electrical connection.

A well 18 is formed over a given depth range beneath the top surface 11 of the substrate 12. The well 18 is surrounded inside the substrate 12 by the well 16, which provides a tub of oppositely-doped semiconductor material. The well 18 may be accessible at the top surface 11 of the substrate 12 for the subsequent establishment of an electrical connection. The well 18 may be formed in the substrate 12 by introducing a dopant by, for example, ion implantation with given implantation conditions. The implantation conditions (e.g., ion species, dose, kinetic energy) may be selected to tune the electrical and physical characteristics of the well 18. The well 18 may be comprised of semiconductor material that is doped to have the same conductivity type as the substrate 12 and an opposite conductivity type from the well 16. In an embodiment, the well 18 may be comprised of semiconductor material that is doped with a p-type dopant (e.g., boron)

to provide p-type conductivity. In an embodiment, the dose of the dopant implanted to form the well 18 may range from $1\times10^{12}$ ions/cm$^2$ to $1\times10^{13}$ ions/cm$^2$. The well 18 may provide a high-voltage well in the completed structure 10.

Body wells 20, 22 are formed within the well 18 in the active region of the substrate 12. The body wells 20, 22 are comprised of semiconductor material of the substrate 12 that is doped to have a given conductivity type. The body wells 20, 22 are accessible at the top surface 11 of the substrate 12 for the subsequent establishment of electrical connections. The body well 20 is laterally spaced in the substrate 12 from the body well 22. The body well 20 is embedded inside the well 18, and the body well 22 is also embedded inside the well 18.

The body wells 20, 22 may be formed by introducing a dopant of a given conductivity type by, for example, ion implantation into the substrate 12. A patterned implantation mask may be formed to define selected areas on the top surface 11 of the substrate 12 that are exposed for implantation. The openings in the implantation mask determine, at least in part, the location and horizontal dimensions of the body wells 20, 22. The implantation mask may include a layer of an organic photoresist that is applied and patterned to form the openings exposing the selected areas on the top surface 11 of the substrate 12. The implantation mask has a thickness and stopping power sufficient to block implantation in masked areas.

The implantation conditions (e.g., ion species, dose, kinetic energy) may be selected to tune the electrical and physical characteristics of the body wells 20, 22. In an embodiment, the body wells 20, 22 may be comprised of semiconductor material doped with a concentration of a p-type dopant (e.g., boron) to provide p-type conductivity. In an embodiment, the dose of the dopant implanted to form the body wells 20, 22 may range from $1\times10^{12}$ ions/cm$^2$ to $1\times10^{14}$ ions/cm$^2$, which is additive to the dose used to form the well 18 such that the body wells 20, 22 have a higher dopant concentration than the well 18.

A drain well 24 is formed within the well 18 in the active region of the substrate 12. The drain well 24 is comprised of semiconductor material of the substrate 12 that is doped to have an opposite conductivity type from the body wells 20, 22. The drain well 24 is accessible at the top surface 11 of the substrate 12 for the subsequent establishment of an electrical connection. The drain well 24 is laterally positioned in the substrate 12 between the body well 20 and the body well 22. The drain well 24 includes an edge 30 adjacent to the body well 20 and an opposite edge 32 adjacent to the body well 22. In an embodiment, the edge 30 may be aligned parallel to the edge 32 such that the drain well has a uniform width dimension, and the edges 30, 32 may be featureless.

The drain well 24 may be formed by introducing a dopant of a given conductivity type by, for example, ion implantation into the substrate 12. A patterned implantation mask 26 may be formed to define a selected area on the top surface 11 of the substrate 12 that is exposed for implantation. The opening 28 in the implantation mask 26 determines, at least in part, the location and horizontal dimensions of the drain well 24, as well as the locations of the edges 30, 32. The implantation mask 26 may include a layer of an organic photoresist that is applied and patterned to form the opening 28 exposing the selected area on the top surface 11 of the substrate 12. The implantation mask 26 has a thickness and stopping power sufficient to block implantation in masked areas.

The implantation conditions (e.g., ion species, dose, kinetic energy) may be selected to tune the electrical and physical characteristics of the drain well 24. In an embodiment, the drain well 24 may be comprised of semiconductor material that is doped with a concentration of an n-type dopant (e.g., phosphorus) to provide n-type conductivity. In an embodiment, the dose of the dopant implanted to form the drain well 24 may range from $1\times10^{12}$ ions/cm$^2$ to $1\times10^{15}$ ions/cm$^2$. The drain well 24 may provide a drift region for the extended drain in the completed structure 10.

The laterally-spaced arrangement of the drain well 24 relative to the body well 20 defines a gap G1 between the edge 30 of the drain well 24 and the body well 20. The laterally-spaced arrangement of the drain well 24 relative to the body well 22 defines a gap G2 between the edge 32 of the drain well 24 and the body well 22. The gap G1 extends laterally from the edge 30 of the drain well 24 to the body well 20, and the gap G2 extends laterally from the edge 32 of the drain well 24 to the body well 22. In an embodiment, the gap G1 may have a uniform (i.e., constant) width dimension between the edge 30 of the drain well 24 and the body well 20, and the gap G2 may have a uniform (i.e., constant) width dimension between the edge 32 of the drain well 24 and the body well 22. The space inside the gaps G1, G2 is filled by portions of the well 18, which is more lightly doped than the body wells 20, 22 and is oppositely doped from the drain well 24. The gaps G1, G2 are determined by the placement of the body wells 20, 22 and the drain well 24 during the respective masked implantations. In that regard, the width of the opening 28 in the implantation mask 26 may be a variable that can be used to define the horizontal dimensions and shape of the gaps G1, G2.

With reference to FIGS. 2, 3, 3A, 3B in which like reference numerals refer to like features in FIG. 1 and at a subsequent fabrication stage, gate electrodes 34 and gate dielectric layers 36 defining a pair of gates in a split-gate arrangement are formed. Each gate dielectric layer 36 is comprised of a dielectric material, such as silicon dioxide formed by thermal oxidation of the semiconductor material of the substrate 12. Each gate electrode 34 is comprised of a conductor, such as doped polysilicon. The gate electrodes 34 and gate dielectric layers 36 may be formed by patterning deposited layers of their respective materials with lithography and etching processes. The gap G1 may be fully overlapped by one of the gate electrodes 34, and the gap G2 may be fully overlapped by the other of the gate electrodes 34. Each of the gate electrodes 34 includes a sidewall 35, and the sidewalls 35 of the different gate electrodes 34 are positioned adjacent to each.

Figure 2:
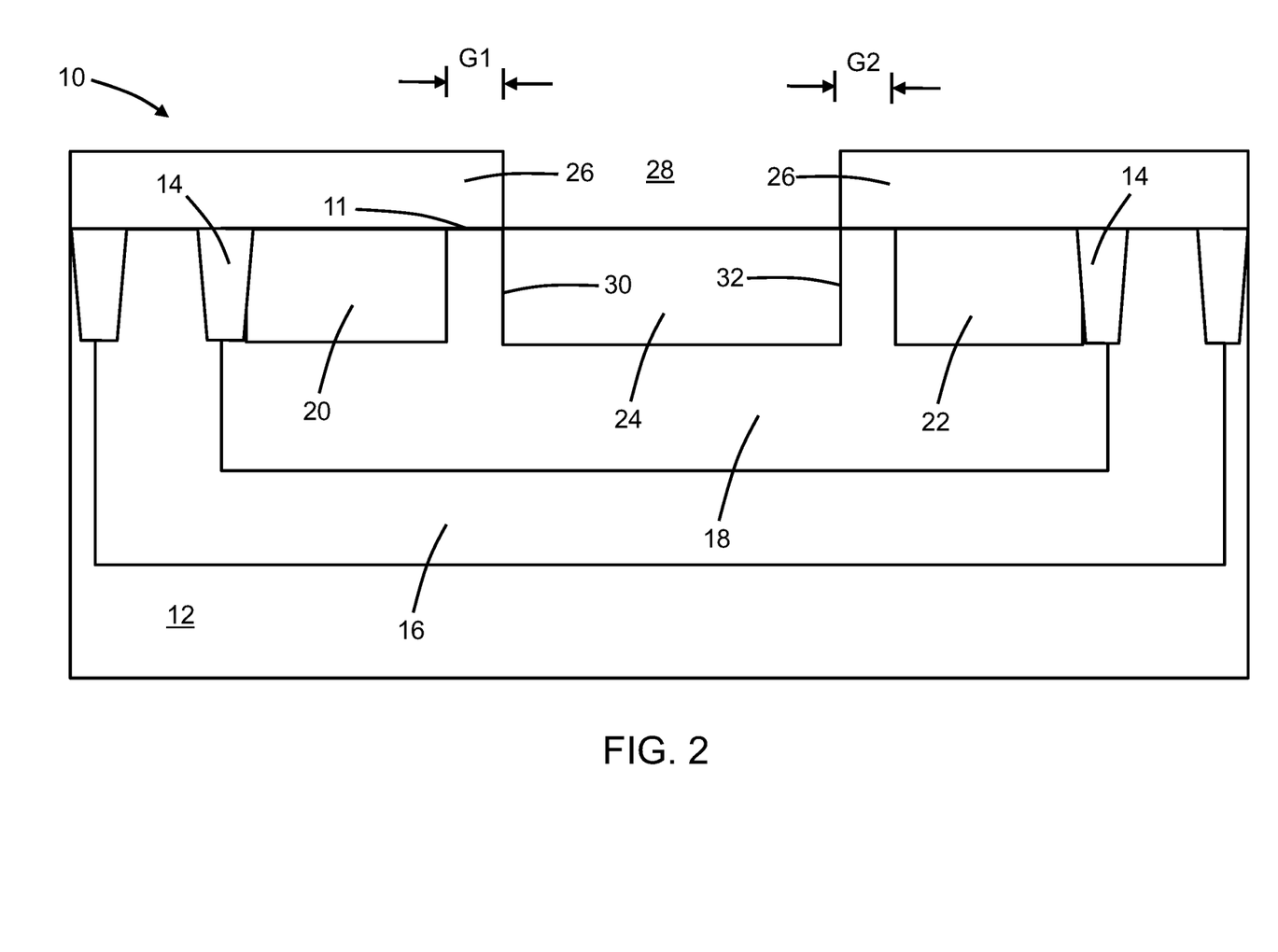
FIG. 2 is a cross-sectional view taken generally along line 2-2 in FIG. 1.
Figure 3:
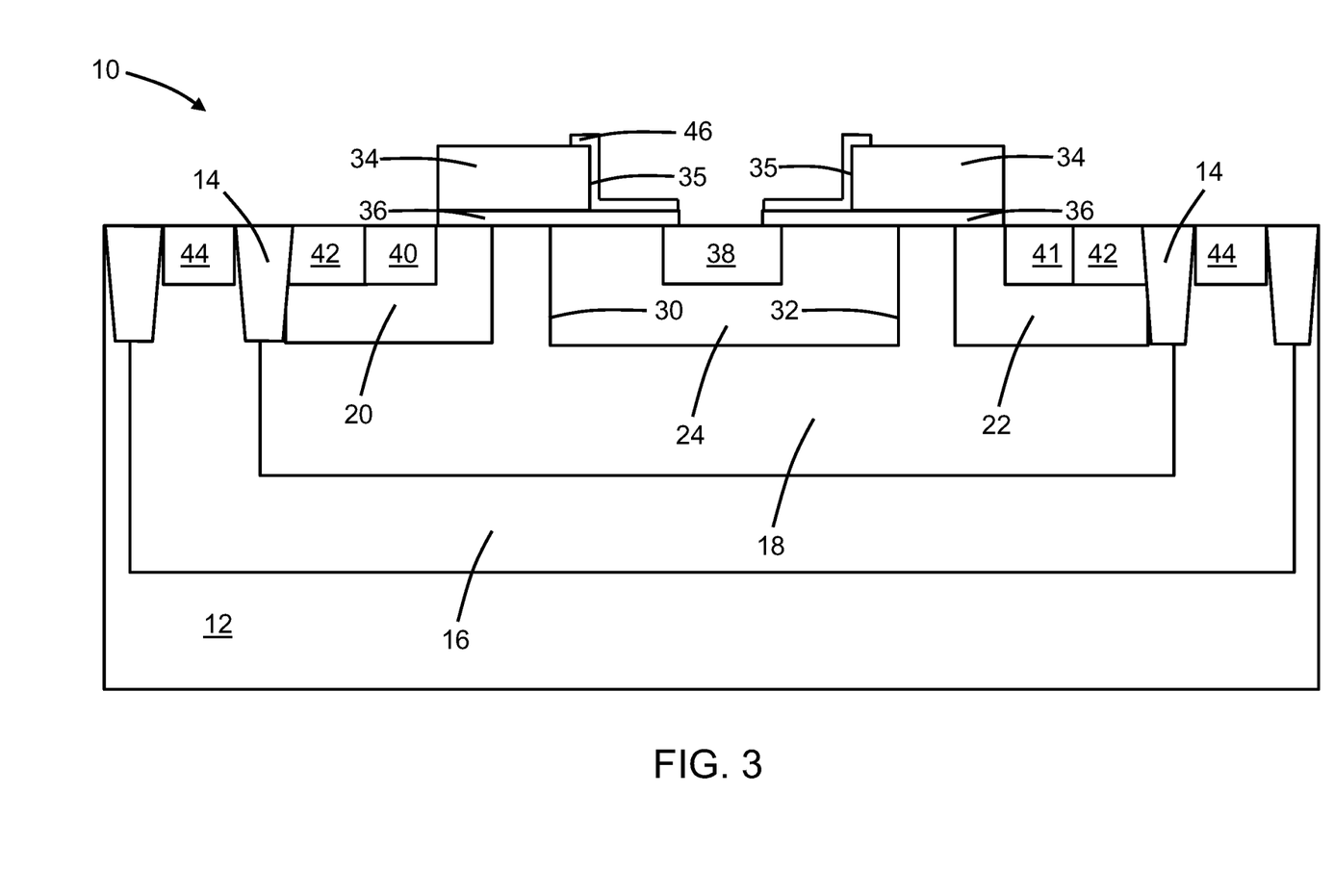
FIG. 3 is a top view of the structure at a fabrication stage subsequent to FIG. 1.

A drain region 38 for the extended-drain metal-oxide-semiconductor device is formed in the drain well 24. Source regions 40, 41 and body contact regions 42 for the extended-drain metal-oxide-semiconductor device are formed in the body wells 20, 22. The source regions 40, 41 and the drain region 38 may be doped to have an opposite conductivity type from the body contact regions 42. The source regions 40, 41, which are respectively disposed in the body wells 20, 22, may be doped to have an opposite conductivity type from the body wells 20, 22 and may be heavily doped. The drain region 38, which is disposed in the drain well 24, may be doped to have the same conductivity type as the drain well 24 but at a higher dopant concentration (e.g., heavily doped). The body contact regions 42, which are disposed in the body wells 20, 22 and may have an abutting relationship with the source regions 40, 41, may be doped to have the same conductivity type as the body wells 20 but at a higher dopant concentration (e.g., heavily doped). In an embodiment, the drain region 38 and the source regions 40, 41 may be doped with an n-type dopant (e.g., phosphorus) to provide n-type conductivity, and the body contact regions 42 may be doped with a p-type dopant (e.g., boron) to provide p-type conductivity. In an embodiment, the dose of the dopant implanted to form the drain region 38 and source regions 40, 41 may range from $1\times10^{14}$ ions/cm$^2$ to $1\times10^{15}$ ions/cm$^2$. In an embodiment, the dose of the dopant implanted to form the body contact regions 42 may range from $1\times10^{14}$ ions/cm$^2$ to $1\times10^{15}$ ions/cm$^2$.

The drain region 38 and the source regions 40, 41 may be formed by selectively implanting ions, such as ions including the n-type dopant, with an implantation mask having openings defining the intended locations for the source regions 40, 41 and the drain region 38 in the substrate 12. The body contact regions 42 may be formed by selectively implanting ions, such as ions including the p-type dopant, with a different implantation mask having openings defining the intended locations for the body contact regions 42 in the substrate 12. Contact regions 44 to the well 18 and contact regions (not shown) to the substrate 12 may be formed in a similar manner.

A dielectric layer 46 is formed that coats the sidewall 35 of each gate electrode 34, a portion of each gate electrode 34 adjacent to the sidewall 35, and a portion of each gate dielectric layer 36 that is laterally between the drain region 38 and the gate electrode 34. The dielectric layer 46 may be comprised of, for example, silicon nitride that is conformally deposited and then patterned by lithography and etching processes.

Middle-of-line (MOL) processing and back-end-of-line (BEOL) processing follow, which includes formation of an interconnect structure coupled with the structure 10. In particular, the interconnect structure may include one or more contacts that are coupled with each gate electrode 34, one or more contacts that are coupled with the drain region 38, one or more contacts that are coupled with each of the source regions 40, 41, and one or more contacts that are coupled with each of the body contact regions 42.

The structure 10, in which the drain well 24 is laterally spaced by gaps from each of the body wells 20, 22, may exhibit a significantly reduced output capacitance in comparison with device structures in which the drain well is abutted with the body wells. The switching performance of an extended-drain metal-oxide-semiconductor device based on the structure 10 may be improved to, for example, compensate for reductions in device size.

Figure 4:
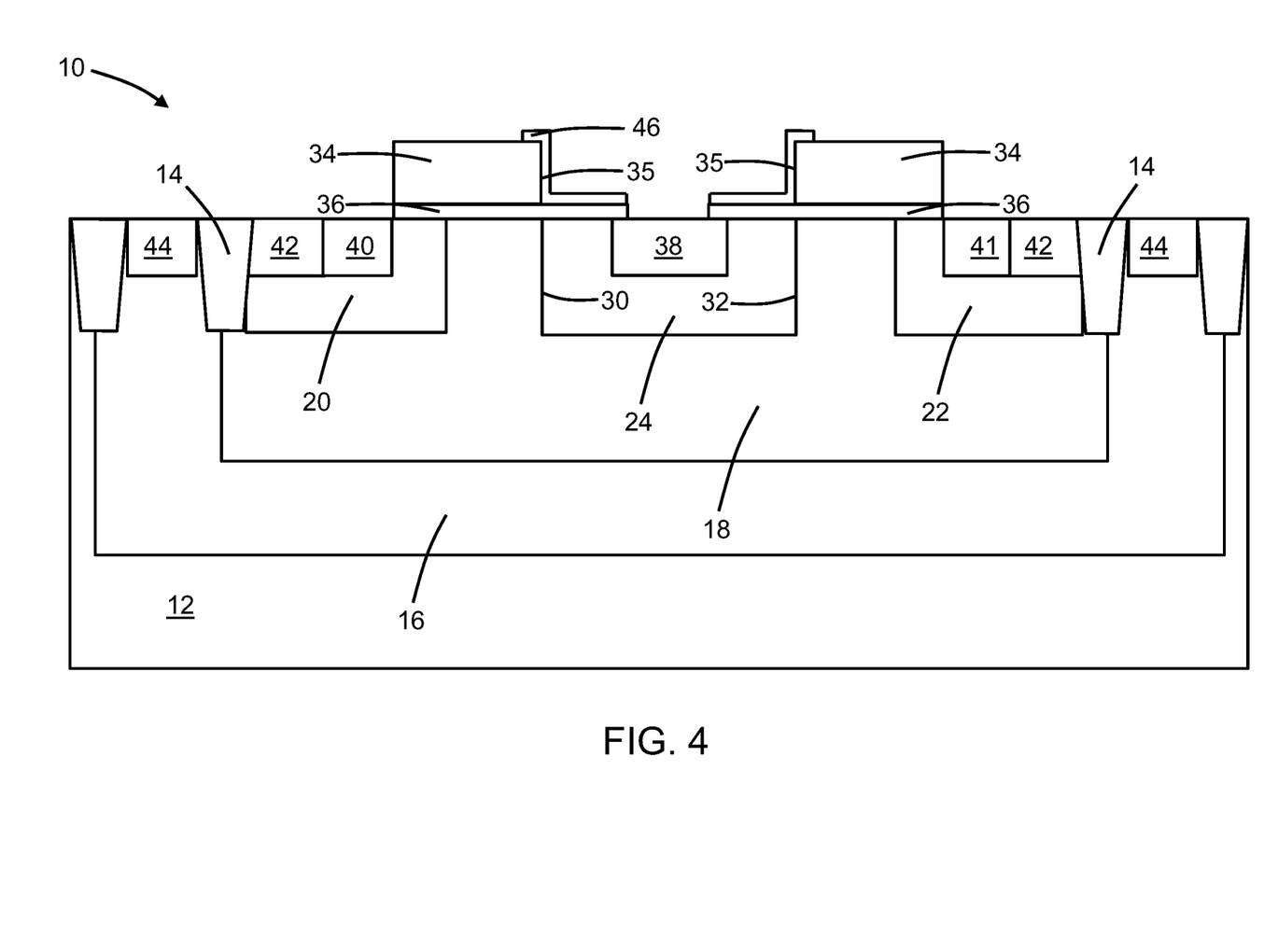
FIG. 4 is a cross-sectional view of a structure in accordance with alternative embodiments of the invention.

With reference to FIG. 4 in which like reference numerals refer to like features in FIG. 3 and in accordance with alternative embodiments of the invention, the drain well 24 may be formed after the gate electrodes 34 are formed and in a self-aligned manner relative to the gate electrodes 34. The width of the opening 28 in the implantation mask 26 is selected to overlap with the gate electrodes 34 and open the space between the gate electrodes 34 for implantation. The edges 30, 32 of the drain well 24 are aligned with the sidewalls 35 of the respective gate electrodes 34.

Figure 5:
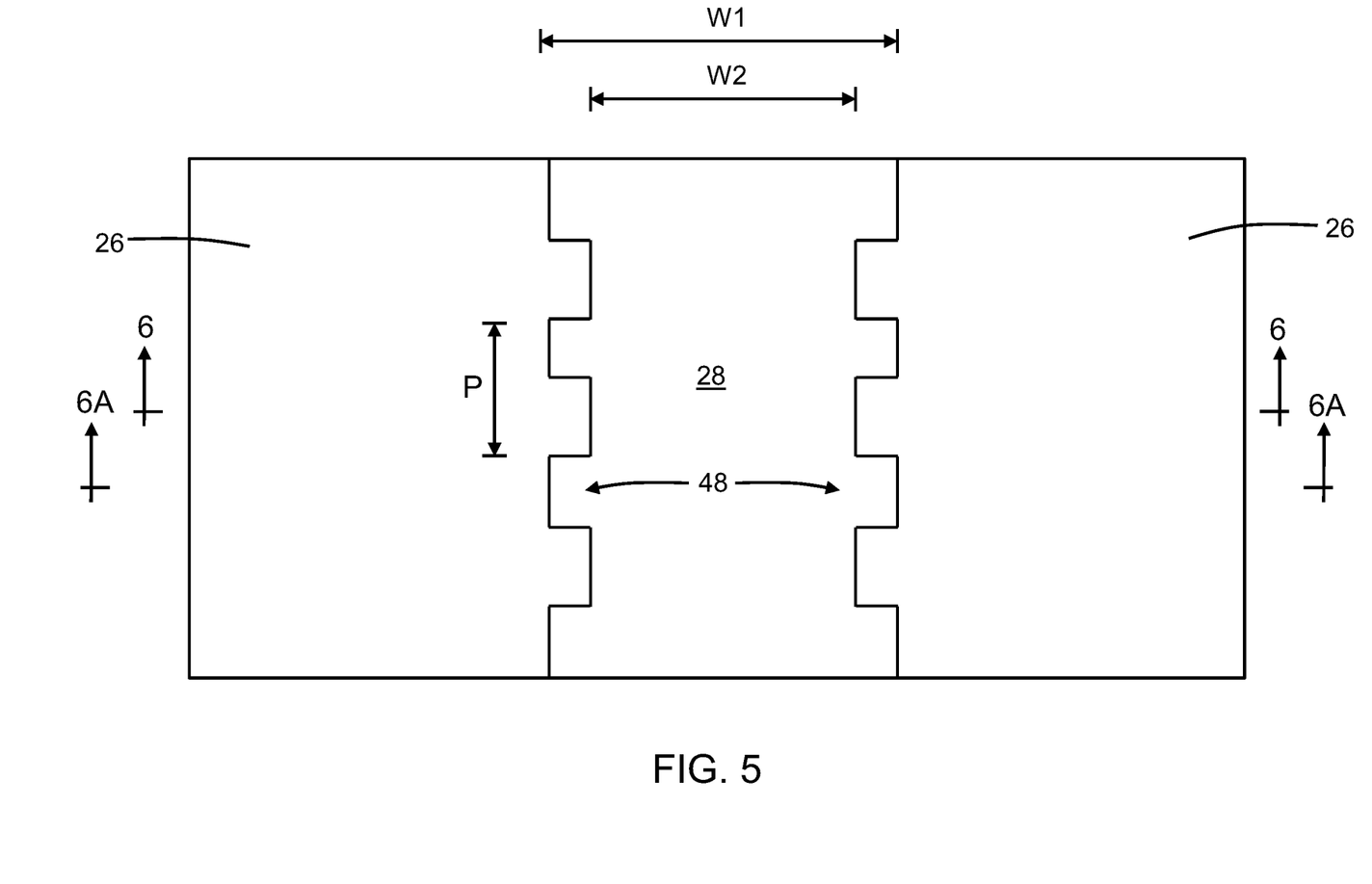
FIG. 5 is a top view of a structure in accordance with alternative embodiments of the invention.
Figure 6:
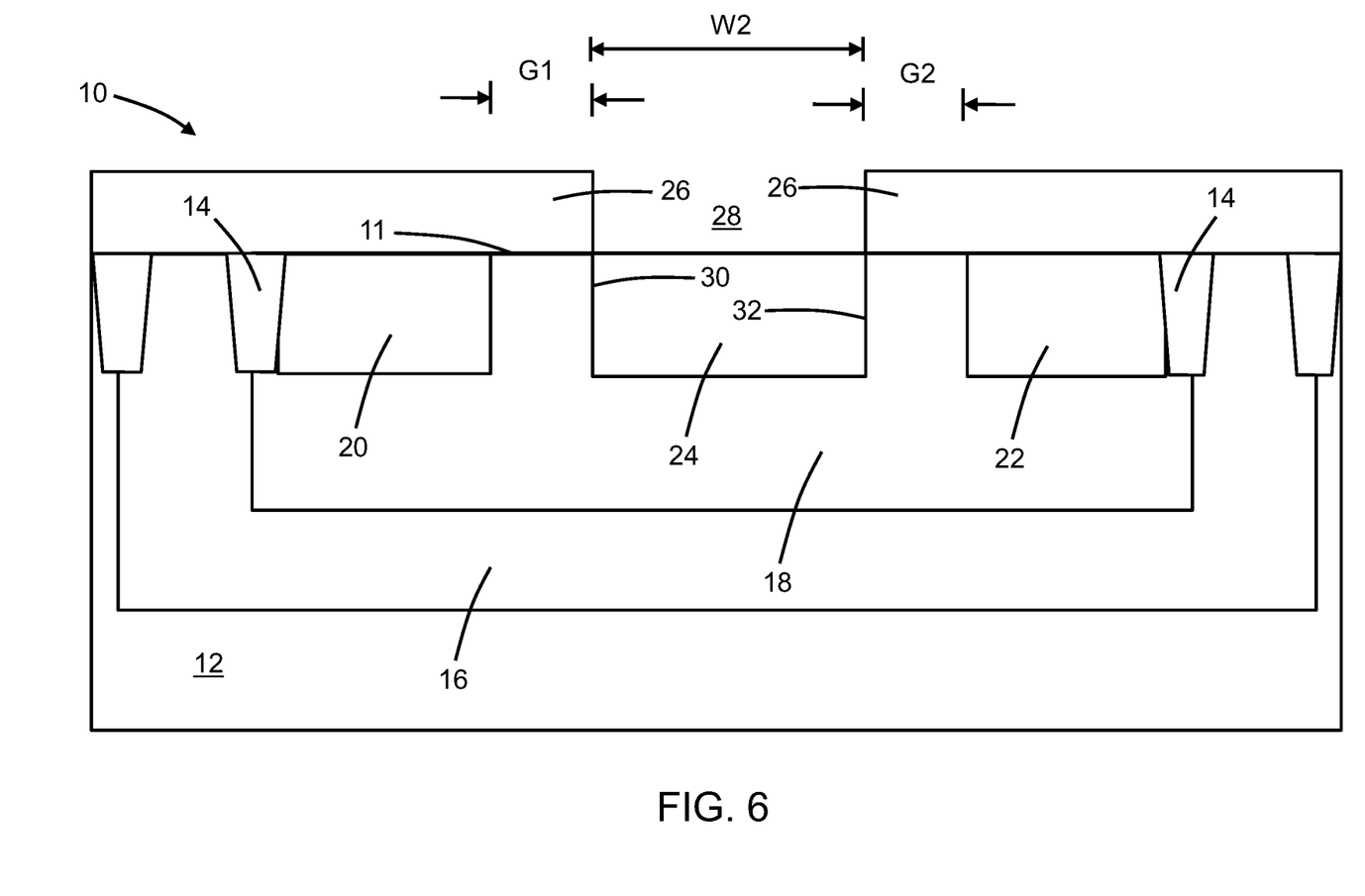
FIG. 6 is a cross-sectional view taken generally along line 6-6 in FIG. 5.
Figure 6A:
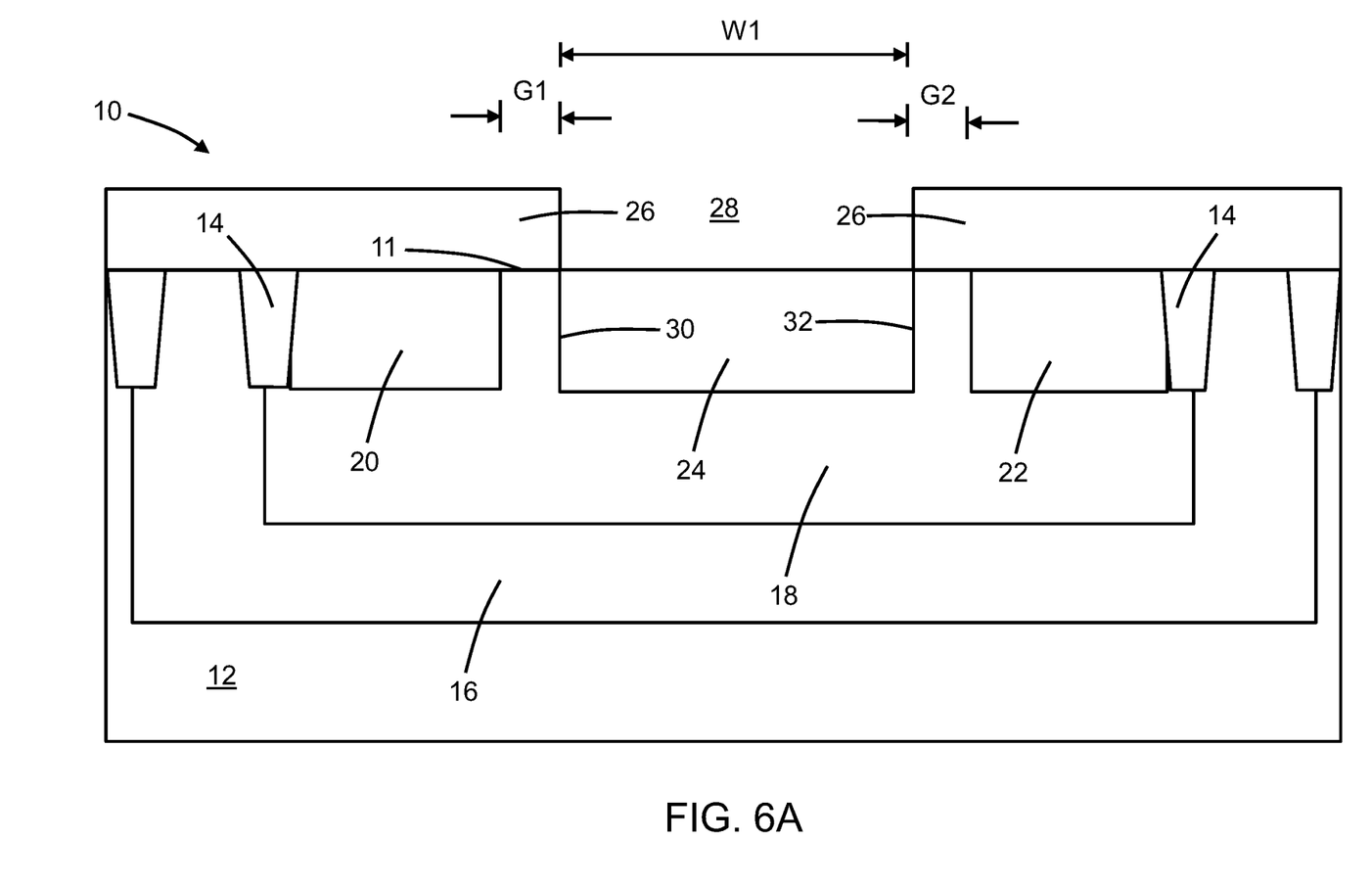
FIG. 6A is a cross-sectional view taken generally along line 6A-6A in FIG. 5.

With reference to FIGS. 5, 6, 6A in which like reference numerals refer to like features in FIG. 1 and in accordance with alternative embodiments of the invention, the gap G1 between the body well 20 and the drain well 24 may be modified to have a width dimension that varies with position along the edge 30, and the gap G2 between the body well 22 and the drain well 24 may also be modified to have a width dimension that varies with position along the edge 32. The variation in the width dimension of the gaps G1, G2 modulates the width dimension of the drain well 24 between a width W1 and a width W2 that is less than the width W1. In an embodiment, the modulated gap G1 of varying width may be fully overlapped by one of the gate electrodes 34, and the modulated gap G2 of varying width may be fully overlapped by the other of the gate electrodes 34.

The drain well 24 includes notches 48 that are inset into each of the edges 30, 32. The notches 48 along the edge 30 may be aligned with the notches 48 along the edge 32 to provide the variation of the width dimension of the drain well 24 between the width W1 and the width W2. The notches 48 have a depth equal to one-half of a difference between the width W1 and the width W2. In an embodiment, the notches 48 may have a uniform pitch P along each of the edges 30, 32.

The implantation mask 26 used to form the drain well 24 may be used to provide the notches 48. In particular, the opening 28 in the implantation mask 26 may be shaped with a varied width dimension to generate the multiple widths W1, W2 of the drain well 24.

The process flow continues to complete the structure 10 as previously described.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an extended-drain metal-oxide-semiconductor device, the structure comprising:
   a semiconductor substrate including a buried isolation well and a high-voltage well;
   a first body well in the high-voltage well;
   a first source region in the first body well;
   a drain well in the high-voltage well, the drain well including a first edge adjacent to the first body well, and the first edge of the drain well having a first spaced relationship with the first body well;
   a drain region in the drain well; and
   a first gate electrode laterally positioned between the first source region and the drain region,
   wherein the first edge of the drain well and the first body well are separated by a first gap that is filled by a first portion of the high-voltage well, the first gap includes a first plurality of notches positioned along the first edge of the drain well, the first gap has a width dimension that varies with position along the first edge, and the first gap is fully overlapped by the first gate electrode.

2. The structure of claim 1 wherein the first plurality of notches have a uniform pitch along the first edge of the drain well.

3. The structure of claim 1 further comprising:
   a second body well in the high-voltage well;
   a second source region in the second body well; and
   a second gate electrode laterally positioned between the second source region and the drain region,
   wherein the drain well includes a second edge adjacent to the second body well, and the second edge of the drain well has a second spaced relationship with the second body well.

4. The structure of claim 3 wherein the second edge of the drain well and the second body well are separated by a second gap that is filled by a second portion of the high-voltage well, the second gap includes a second plurality of notches positioned along the second edge of the drain well, the second gap has a width dimension that varies with position along the first edge, and the second gap is fully overlapped by the second gate electrode.

5. The structure of claim 4 wherein the first plurality of notches along the first edge are aligned with the second plurality of notches along the second edge.

6. The structure of claim 1 wherein the semiconductor substrate includes a buried isolation well, the high-voltage well is surrounded by the buried isolation well, the buried isolation well has a first conductivity type, and the high-voltage well has a second conductivity type opposite to the first conductivity type.

7. The structure of claim 6 wherein the first body well has the second conductivity type, and the first body well has a higher dopant concentration than the high-voltage well.

8. The structure of claim 3 wherein the drain region is laterally positioned between the first gate electrode and the second gate electrode.

9. The structure of claim 3 wherein the drain region, the first gate electrode, and the second gate electrode are laterally positioned between the first source region and the second source region.

10. A method of forming a structure for an extended-drain metal-oxide-semiconductor device, the method comprising:
    forming a high-voltage well in a semiconductor substrate;
    forming a body well in the high-voltage well;
    forming a source region in the body well;
    forming a drain well in the high-voltage well, wherein the drain well includes an edge adjacent to the body well, and the edge of the drain well has a spaced relationship with the body well;
    forming a drain region in the drain well; and
    forming a gate electrode laterally positioned between the source region and the drain region,
    wherein the edge of the drain well and the body well are separated by a gap that is filled by a portion of the high-voltage well, the gap includes a plurality of notches along the edge of the drain well, the gap has a width dimension that varies with position along the edge, and the gap is fully overlapped by the first gate electrode.

* * * * *